United States Patent
Hirose et al.

(10) Patent No.: US 7,884,034 B2
(45) Date of Patent: Feb. 8, 2011

(54) METHOD OF MANUFACTURING SEMICONDUCTOR DEVICE AND SUBSTRATE PROCESSING APPARATUS

(75) Inventors: Yoshiro Hirose, Toyama (JP); Yushin Takasawa, Toyama (JP); Tomohide Kato, Toyama (JP); Nanori Akae, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 12/551,001

(22) Filed: Aug. 31, 2009

(65) Prior Publication Data

US 2010/0055927 A1    Mar. 4, 2010

(30) Foreign Application Priority Data

Sep. 2, 2008 (JP) .............................. 2008-224224

(51) Int. Cl.
    H01L 21/31    (2006.01)
(52) U.S. Cl. ................. 438/791; 257/E21.24
(58) Field of Classification Search .............. 438/791
    See application file for complete search history.

(56) References Cited

U.S. PATENT DOCUMENTS 6,908,852 B2 *   6/2005   Adetutu et al. .............. 438/636
2006/0199357 A1 *   9/2006   Wan et al. ................... 438/482

FOREIGN PATENT DOCUMENTS

| JP | 58-034978   | 3/1983  |
| JP | J2004-95940 | 3/2004  |
| JP | J2006-135229 | 5/2006 |
| JP | J2006-270016 | 10/2006 |

* cited by examiner

Primary Examiner—Alexander G Ghyka
(74) Attorney, Agent, or Firm—Brundidge & Stanger, P.C.

(57) ABSTRACT

A silicon nitride film including stoichiometrically excessive silicon with respect to nitrogen is formed. The silicon nitride film may be formed by supplying dichlorosilane to a substrate under a condition where CVD (chemical vapor deposition) reaction is caused to form a silicon film including several or less atomic layers on the substrate, supplying ammonia to the substrate in a non-plasma atmosphere to thermally nitride the silicon film under a condition where the nitriding reaction of the silicon film by the ammonia is not saturated, and alternately repeating the supplying of dichlorosilane and the supplying of ammonia.

14 Claims, 5 Drawing Sheets

| No. | Conditions | Step 1 | Step 3 | Results |
|---|---|---|---|---|
| 1 | TE | 600°C | 600°C | Film-forming rate: 1.0 A/cycle or more Si/N ratio: 1.0 |
|   | PR | 6.5 Torr | 6.5 Torr | |
|   | FR | 0.5 slm (DCS) | 5 slm (NH$_3$) | |
|   | Time | 60 sec | 30 sec | |
| 2 | TE | 630°C | 630°C | Film-forming rate: 1.0 A/cycle or more Si/N ratio: 1.0 |
|   | PR | 6.5 Torr | 6.5 Torr | |
|   | FR | 0.5 slm (DCS) | 5 slm (NH$_3$) | |
|   | Time | 10 sec | 30 sec | |
| 3 | TE | 630°C | 630°C | Film-forming rate: 1.0 A/cycle or more Si/N ratio: 1.0 |
|   | PR | 1 Torr | 6.5 Torr | |
|   | FR | 10 slm (DCS) | 5 slm (NH$_3$) | |
|   | Time | 10 sec | 30 sec | |
| 4 | TE | 630°C | 630°C | Film-forming rate: 1.0 A/cycle or more Si/N ratio: 1.0 |
|   | PR | 1 Torr | 6.5 Torr | |
|   | FR | 0.5 slm (DCS) | 5 slm (NH$_3$) | |
|   | Time | 30 sec | 30 sec | |
| 5 | TE | 630°C | 630°C | Film-forming rate: 1.0 A/cycle or more Si/N ratio: 1.0 |
|   | PR | 1 Torr | 6.5 Torr | |
|   | FR | 0.5 slm (DCS) | 1 slm (NH$_3$) | |
|   | Time | 15 sec | 6 sec | |
| 6 | TE | 630°C | 630°C | Film-forming rate: 1.0 A/cycle or more Si/N ratio: 0.9 |
|   | PR | 1 Torr | 6.5 Torr | |
|   | FR | 0.5 slm (DCS) | 10 slm (NH$_3$) | |
|   | Time | 15 sec | 6 sec | |

* Step 1: Si deposition, Step 2: thermal nitridation
* TE: temperature, PR: pressure, FR: flowrate

Fig. 4A

| No. | Conditions | Step 1 | Step 3 | Results |
|---|---|---|---|---|
| 1 | TE | 600°C | 600°C | Film-forming rate: 1.0 Å/cycle or more Si/N ratio: 1.0 |
| | PR | 6.5 Torr | 6.5 Torr | |
| | FR | 0.5 slm (DCS) | 5 slm (NH$_3$) | |
| | Time | 60 sec | 30 sec | |
| 2 | TE | 630°C | 630°C | Film-forming rate: 1.0 Å/cycle or more Si/N ratio: 1.0 |
| | PR | 6.5 Torr | 6.5 Torr | |
| | FR | 0.5 slm (DCS) | 5 slm (NH$_3$) | |
| | Time | 10 sec | 30 sec | |
| 3 | TE | 630°C | 630°C | Film-forming rate: 1.0 Å/cycle or more Si/N ratio: 1.0 |
| | PR | 1 Torr | 6.5 Torr | |
| | FR | 10 slm (DCS) | 5 slm (NH$_3$) | |
| | Time | 10 sec | 30 sec | |
| 4 | TE | 630°C | 630°C | Film-forming rate: 1.0 Å/cycle or more Si/N ratio: 1.0 |
| | PR | 1 Torr | 6.5 Torr | |
| | FR | 0.5 slm (DCS) | 5 slm (NH$_3$) | |
| | Time | 30 sec | 30 sec | |
| 5 | TE | 630°C | 630°C | Film-forming rate: 1.0 Å/cycle or more Si/N ratio: 1.0 |
| | PR | 1 Torr | 6.5 Torr | |
| | FR | 0.5 slm (DCS) | 1 slm (NH$_3$) | |
| | Time | 15 sec | 6 sec | |
| 6 | TE | 630°C | 630°C | Film-forming rate: 1.0 Å/cycle or more Si/N ratio: 0.9 |
| | PR | 1 Torr | 6.5 Torr | |
| | FR | 0.5 slm (DCS) | 10 slm (NH$_3$) | |
| | Time | 15 sec | 6 sec | |

\* Step 1: Si deposition, Step 2: thermal nitridation
\* TE: temperature, PR: pressure, FR: flowrate

Fig. 4B

| No. | Conditions | Step 1 | Step 3 | Results |
|---|---|---|---|---|
| 1 | TE | 630°C | 630°C | Film-forming rate: 1.0 Å/cycle or more  Si/N ratio: 0.75 |
|  | PR | 1 Torr | 6.5 Torr |  |
|  | FR | 0.5 slm (DCS) | 1 slm ($NH_3$) |  |
|  | Time | 15 sec | 24 sec |  |
| 2 | TE | 630°C | 630°C | Film-forming rate: 1.0 Å/cycle or more  Si/N ratio: 0.75 |
|  | PR | 1 Torr | 20 Torr |  |
|  | FR | 0.5 slm (DCS) | 1 slm ($NH_3$) |  |
|  | Time | 15 sec | 6 sec |  |
| 3 | TE | 630°C | 630°C | Film-forming rate: 1.0 Å/cycle or more  Si/N ratio: 0.75 |
|  | PR | 1 Torr | 5 Torr |  |
|  | FR | 0.5 slm (DCS) | 5 slm ($NH_3$, plasma) |  |
|  | Time | 30 sec | 30 sec |  |
| 4 | TE | 600°C | - | Si was not deposited |
|  | PR | 0.5 Torr | - |  |
|  | FR | 0.5 slm (DCS) | - |  |
|  | Time | 10 sec | - |  |
| * Step 1: Si deposition, Step 2: thermal nitridatin |
| * TE: temperature, PR: pressure, FR: flowrate |

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-224224, filed on Sep. 2, 2008, in the Japanese Patent Office, the entire contents of which are hereby incorporated by reference.

BACKGROUND OF THE INVENTION

1. Field of the Invention

The present invention relates to a semiconductor device manufacturing method including a substrate processing process, and a substrate processing apparatus.

2. Description of the Prior Art

As a process of a plurality of processes of manufacturing a semiconductor device such as a dynamic random access memory (DRAM), a substrate processing process may be performed to form a silicon-rich silicon nitride film (i.e., a silicon nitride film containing stoichiometrically excessive silicon with respect to nitrogen) on a substrate by supplying dichlorosilane (DCS, $SiH_2Cl_2$) and ammonia ($NH_3$) to the substrate (For example, refer to Patent Document 1).

[Patent Document 1]

Japanese Unexamined Patent Application Publication No. 2004-95940

Such a silicon nitride film is formed at a relatively high film-forming temperature of 750° C. to 900° C. However, a method of forming a silicon nitride film while controlling the composition ratio of silicon (Si) and nitrogen (N) (Si/N ratio) of the silicon nitride film at a relatively low temperature has not been developed.

SUMMARY OF THE INVENTION

An object of the present invention is to provide a method of manufacturing a semiconductor device and a substrate processing apparatus, which are adapted to form a silicon nitride film on a substrate while controlling the silicon (Si)/nitrogen (N) ratio of the silicon nitride film (that is, adapted to form a silicon nitride film including stoichiometrically excessive silicon with respect to nitrogen) at a relatively low temperature.

According to an aspect of the present invention, there is provided a method of manufacturing a semiconductor device, the method including forming a silicon nitride film on a substrate in a process chamber using a dichlorosilane and an ammonia, wherein the forming the silicon nitride film includes repeating a cycle to form a silicon nitride film including stoichiometrically excessive silicon with respect to nitrogen, the cycle including: (a) forming a silicon film including several or less atomic layers on the substrate in the process chamber by supplying the dichlorosilane to the substrate under a condition where a CVD reaction is caused; (b) removing the dichlorosilane remaining in the process chamber; (c) thermally nitriding the silicon film by supplying the ammonia to the substrate in the process chamber and causing a nitriding reaction of the silicon film in a non-plasma atmosphere under a condition where the nitriding reaction of the silicon film by the ammonia is not saturated; and (d) removing the ammonia remaining in the process chamber.

According to another aspect of the present invention, there is provided a substrate processing apparatus including: a process chamber configured to process a substrate; a first gas supply system configured to supply dichlorosilane to an inside of the process chamber; a second gas supply system configured to supply ammonia to the inside of the process chamber; a heater configured to heat the substrate disposed in the process chamber; and a controller configured to control the first gas supply system, the second gas supply system, and the heater, so as to form a silicon nitride film including stoichiometrically excessive silicon with respect to nitrogen on the substrate, by supplying dichlorosilane to the substrate under a condition where CVD reaction is caused to form a silicon film including several or less atomic layers on the substrate, supplying ammonia to the substrate in a non-plasma atmosphere to thermally nitride the silicon film under a condition where the nitriding reaction of the silicon film by the ammonia is not saturated, and alternately repeating the supplying of dichlorosilane and the supplying of ammonia.

BRIEF DESCRIPTION OF THE DRAWINGS

FIG. 4A and FIG. 4B are tables for explaining Examples of the present invention together with Comparative Examples.

DETAILED DESCRIPTION OF THE PREFERRED EMBODIMENTS

The inventors have studied a method of forming a silicon nitride (SiN) film containing stoichiometrically excessive silicon with respect to nitrogen (hereinafter, also called a silicon-rich silicon nitride film) when dichlorosilane is used as a film-forming source. As a result of the study, the inventors have found that a silicon nitride (SiN) film containing stoichiometrically excessive silicon with respect to nitrogen can be formed through a process of supplying dichlorosilane to the inside of a process chamber under a condition where CVD reaction is caused so as to form a silicon film including several or less atomic layers on a substrate, a process of supplying ammonia to the inside of the process chamber in a non-plasma atmosphere so as to thermally nitride the silicon film under a condition where the nitriding of the silicon film by the ammonia is not saturated, and alternately repeating the above processes.

The present invention is made based on the above-described inventors' knowledge. Preferable embodiments of the present invention will be described hereinafter with reference to the attached drawings.

(1) Structure of Substrate Processing Apparatus

Figure 1:
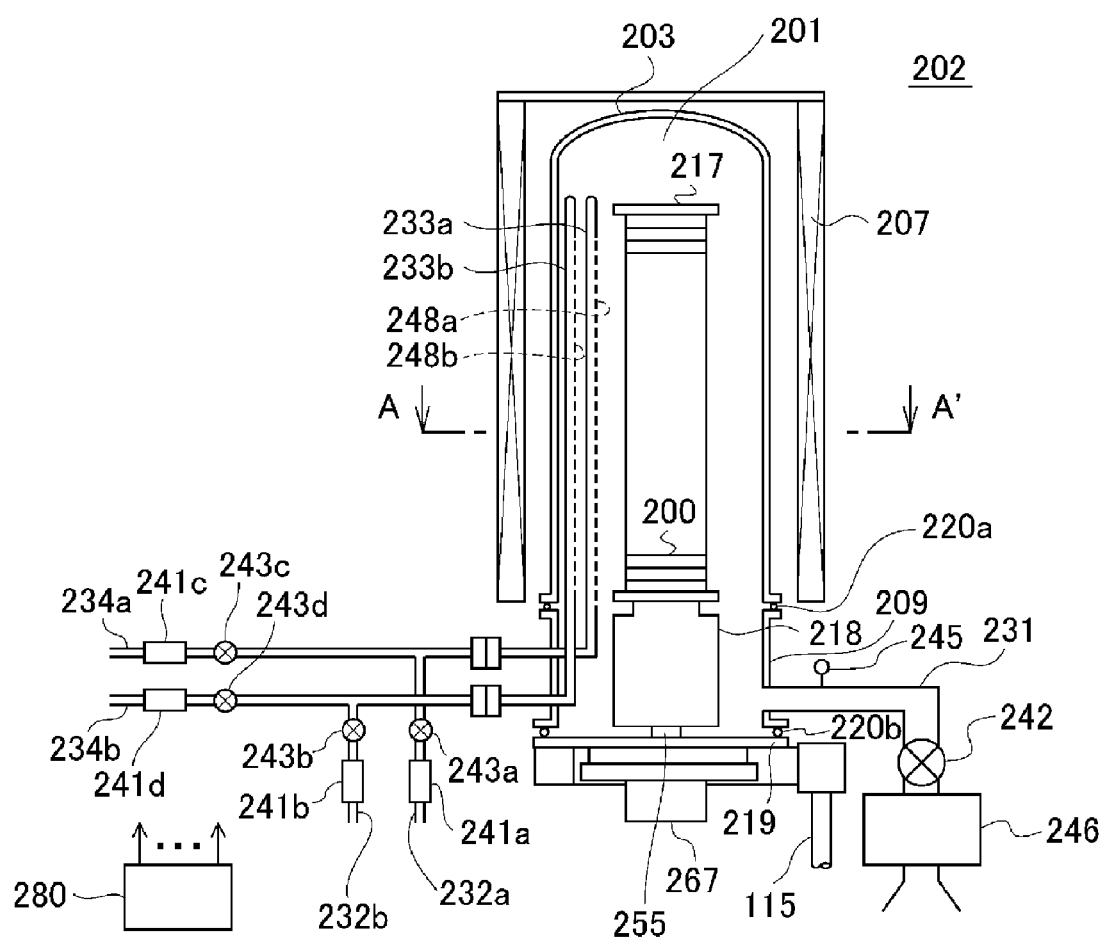
FIG. 1 is a schematic view illustrating a vertical process furnace of a substrate processing apparatus according to an embodiment of the present invention.
Figure 2:
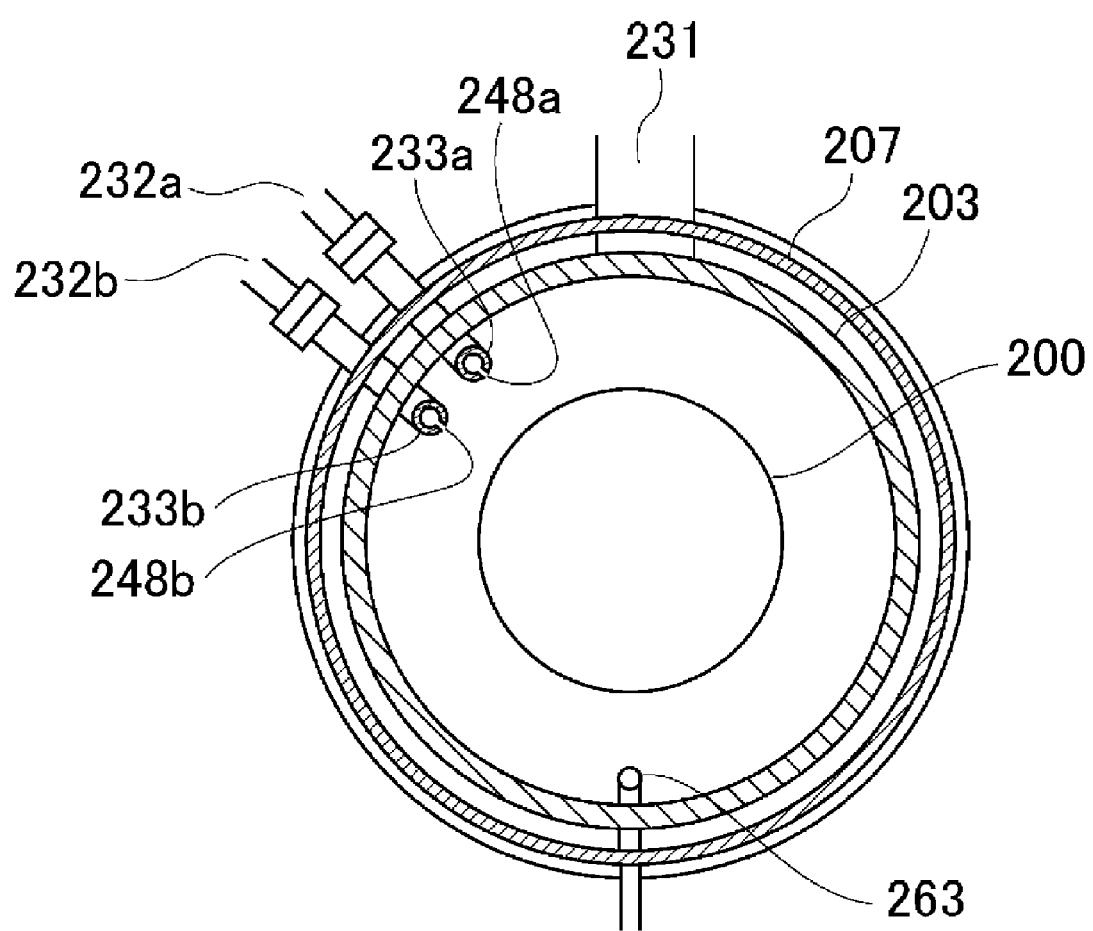
FIG. 2 is a sectional view of the process furnace taken along line A-A' of FIG. 1.

FIG. 1 is a schematic vertical sectional view illustrating a vertical process furnace 202 of a substrate processing apparatus according to an embodiment of the present invention. FIG. 2 is a sectional view of the process furnace taken along line A-A' of FIG. 1. However, the present invention is not limited to the substrate processing apparatus of the current embodiment. For example, the present invention can be applied to a substrate processing apparatus including a single substrate type process furnace, a hot wall type process furnace, or a cold wall type process furnace.

As shown in FIG. 1, the process furnace 202 includes a heater 207 as a heating unit (heating mechanism). The heater 207 has a cylindrical shape and is vertically installed in a state where the heater 207 is supported by a heater base (not shown) used as a holding plate.

Inside the heater 207, a process tube 203 used as a reaction tube is installed concentrically with the heater 207. The process tube 203 is made of a heat-resistant material such as quartz ($SiO_2$) or silicon carbide (SiC) and has a cylindrical shape with a closed top side and an opened bottom side. At a cylindrical hollow region of the process tube 203, a process chamber 201 is formed, in which substrates such as wafers 200 can be accommodated in a state where the wafers 200 are horizontally oriented and vertically arranged in multiple stages in a boat 217 (described later).

Under the process tube 203, a manifold 209 is installed concentrically with the process tube 203. The manifold 209 is made of a material such as stainless steel and has a cylindrical shape with opened top and bottom sides. The manifold 209 is engaged with the process tube 203 and installed in a manner such that the manifold 209 supports the process tube 203. Between the manifold 209 and the process tube 203, an O-ring 220a is installed as a seal member. The manifold 209 is supported by the heater base such that the process tube 203 can be vertically installed. The process tube 203 and the manifold 209 constitute a reaction vessel.

At the manifold 209, a first nozzle 233a used as a first gas introducing unit and a second nozzle 233b used as a second gas introducing unit are installed in a manner such that the first and second nozzles 233a and 233b penetrate the sidewall of the manifold 209, and a first gas supply pipe 232a and a second gas supply pipe 232b are connected to the first nozzle 233a and the second nozzle 233b, respectively. In this way, two gas supply pipes are installed as gas supply passes for supplying plural kinds of process gases (here, two kinds of process gases) to the inside of the process chamber 201.

At the first gas supply pipe 232a, a first mass flow controller 241a used as a flowrate controller (flowrate control unit), and a first valve 243a such as an on-off valve are sequentially installed from the upstream side of the first gas supply pipe 232a. A first inert gas supply pipe 234a configured to supply inert gas is connected to the downstream side of the first valve 243a of the first gas supply pipe 232a. At the first inert gas supply pipe 234a, a third mass flow controller 241c used as a flowrate controller (flowrate control unit), and a third valve 243c such as an on-off valve are sequentially installed from the upstream side of the first inert gas supply pipe 234a. The first nozzle 233a is connected to the tip of the first gas supply pipe 232a. The first nozzle 233a is installed in an arc-shaped space between the inner wall of the process tube 203 constituting the process chamber 201 and the wafers 200 from a lower part to an upper part of the inner wall of the process tube 203 along the stacked direction of the wafers 200. First gas supply holes 248a are formed in a lateral side of the first nozzle 233a for supplying gas therethrough. From the lower side to the upper side, the first gas supply holes 248a have the same size and are arranged with the same pitch. A first gas supply system is constituted mainly by the first gas supply pipe 232a, the first mass flow controller 241a, the first valve 243a, and the first nozzle 233a. A first inert gas supply system is constituted mainly by the first inert gas supply pipe 234a, the third mass flow controller 241c, and the third valve 243c.

At the second gas supply pipe 232b, a second mass flow controller 241b used as a flowrate controller (flowrate control unit), and a second valve 243b such as an on-off valve are sequentially installed from the upstream side of the second gas supply pipe 232b. A second inert gas supply pipe 234b configured to supply inert gas is connected to the downstream side of the second valve 243b of the second gas supply pipe 232b. At the second inert gas supply pipe 234b, a fourth mass flow controller 241d used as a flowrate controller (flowrate control unit), and a fourth valve 243d such as an on-off valve are sequentially installed from the upstream side of the second inert gas supply pipe 234b. The second nozzle 233b is connected to the tip of the second gas supply pipe 232b. The second nozzle 233b is installed in an arc-shaped space between the inner wall of the process tube 203 constituting the process chamber 201 and the wafers 200 from a lower part to an upper part of the inner wall of the process tube 203 along the stacked direction of the wafers 200. Second gas supply holes 248b are formed in a lateral side of the second nozzle 233b for supplying gas therethrough. From the lower side to the upper side, the second gas supply holes 248b have the same size and are arranged with the same pitch. A second gas supply system is constituted mainly by the second gas supply pipe 232b, the second mass flow controller 241b, the second valve 243b, and the second nozzle 233b. A second inert gas supply system is constituted mainly by the second inert gas supply pipe 234b, the fourth mass flow controller 241d, and the fourth valve 243d.

For example, dichlorosilane (DCS, $SiH_2Cl_2$) gas is supplied from the first gas supply pipe 232a to the inside of the process chamber 201 through the first mass flow controller 241a, the first valve 243a, and the first nozzle 233a. At the same time, inert gas may be supplied from the first inert gas supply pipe 234a to the first gas supply pipe 232a through the third mass flow controller 241c and the third valve 243c. In addition, ammonia ($NH_3$) gas is supplied from the second gas supply pipe 232b to the inside of the process chamber 201 through the second mass flow controller 241b, the second valve 243b, and the second nozzle 233b. At the same time, inert gas may be supplied from the second inert gas supply pipe 234b to the second gas supply pipe 232b through the fourth mass flow controller 241d and the fourth valve 243d.

At the manifold 209, a gas exhaust pipe 231 is installed so as to exhaust the inside atmosphere of the process chamber 201. To the downstream side of the gas exhaust pipe 231 opposite to the manifold 209, a vacuum pump 246 used as a vacuum exhaust device is connected through a pressure sensor 245 used as a pressure detector and an auto pressure controller (APC) valve 242 used as a pressure regulator. The APC valve 242 is an on-off valve that can be opened and closed for evacuating (vacuum-exhausting) and not evacuating the inside of the process chamber 201 and can be adjusted in degree of valve opening for controlling the inside pressure of the process chamber 201. By adjusting the degree of valve opening of the APC valve 242 based on pressure information detected by the pressure sensor 245 while operating the vacuum pump 246, the inside of the process chamber 201 can be evacuated to a desired pressure (vacuum degree).

Under the manifold 209, a seal cap 219 is installed as a furnace port cover configured to close the opened bottom side of the manifold 209 air-tightly. The seal cap 219 is configured to be brought into contact with the bottom side of the manifold 209 from a lower side of the manifold 209. For example, the seal cap 219 is made of a metal such as stainless steel and has a disk shape. On the top surface of the seal cap 219, an O-ring is installed as a seal member making contact with the bottom side of the manifold 209. At a side of the seal cap 219 opposite to the process chamber 201, a rotary mechanism 267 is installed to rotate the boat 217 (described later) used as a substrate holder. A rotation shaft 255 of the rotary mechanism 267 is connected to the boat 217 through the seal cap 219. The rotary mechanism 267 is configured to rotate wafers 200 by rotating the boat 217. The seal cap 219 is configured to be vertically moved by a boat elevator 115, which is installed vertically outside the process tube 203 as a lift mechanism. The boat elevator 115 is configured to load/unload the boat 217 into/from the process chamber 201 by moving the seal cap 219 upward and downward.

The boat 217 used as a substrate holder is made of a heat-resistant material such as quartz or silicon carbide and is configured to hold a plurality of wafers 200 in a state where the wafers 200 are horizontally oriented and arranged in multiple stages with the centers of the wafer 200 being aligned with one another. At a lower part of the boat 217, an insulation member 218 made of a heat-resistant material such as quartz or silicon carbide is installed, and thus heat transfer from the heater 207 to the seal cap 219 is difficult. The insulation member 218 may include a plurality of insulation plates made of a heat-resistant material such as quartz or silicon carbide, and an insulation plate holder configured to support the insulation plates in a state where the insulation plates are horizontally oriented and arranged in multiple stages. Inside the process tube 203, a temperature sensor 263 is installed as a temperature detector, and based on temperature information detected by the temperature sensor 263, power supplied to the heater 207 is controlled to obtain desired temperature distribution in the process chamber 201. Like the first nozzle 233a and the second nozzle 233b, the temperature sensor 263 is installed along the inner wall of the process tube 203.

A controller 280 which is a control unit (control device) is connected to components such as the first to fourth mass flow controllers 241a, 241b, 241c, and 241d, the first to fourth valves 243a, 243b, 243c, and 243d, the pressure sensor 245, the APC valve 242, the heater 207, the temperature sensor 263, the vacuum pump 246, the rotary mechanism 267, and the boat elevator 115. The controller 280 controls operations such as flowrate adjustment operations of the mass flow controllers 241a, 241b, 241c, and 241d; opening/closing operations of the valves 243a, 243b, 243c, and 243d; opening/closing operations of the APC valve 242, and pressure adjustment operations of the APC valve 242 by using the pressure sensor 245; temperature adjustment operations of the heater 207 by using the temperature sensor 263; start/stop operations of the vacuum pump 246; rotation velocity adjustment operations of the rotary mechanism 267; and lifting operations of the boat elevator 115.

(2) Method of Forming Silicon Nitride Film

Next, as a process of a plurality of processes of manufacturing a semiconductor device, a method of forming a silicon nitride (SiN) film containing stoichiometrically excessive silicon (Si) with respect to nitrogen (N) (i.e., a silicon-rich silicon nitride film) with the process furnace of the above-described substrate processing apparatus by using dichlorosilane (DCS) and ammonia ($NH_3$) will now be described according to an embodiment. In the following description, the operations of the components of the substrate processing apparatus are controlled by the controller 280.

In the current embodiment, a film-forming process is performed by a method similar to an atomic layer deposition (ALD) method but somewhat different from the ALD method. An ALD method is a film-forming method, which is performed under certain film-forming conditions (temperature, time, etc.) by alternately supplying at least two kinds of reactive gases being film-forming source to a substrate so as to allow the substrate to adsorb the gases in units of an atom and by using surface reaction. At this time, film thickness is controlled by adjusting the number of reactive gas supply cycles (for example, if a film having a thickness of 20 Å is formed at a film-forming rate of 1 Å/cycle, twenty cycles may be performed).

That is, in the film-forming method of the current embodiment, a process of supplying dichlorosilane to a wafer 200 under a condition where CVD reaction is caused, and a process of supplying ammonia to the wafer 200 in a non-plasma atmosphere under certain conditions are alternately repeated so as to form a silicon-rich silicon nitride (SiN) film. In the current embodiment, a process (Step 1) of supplying dichlorosilane to a wafer 200, a process (Step 2) of removing dichlorosilane over the wafer 200, a process (Step 3) of supplying ammonia to the wafer 200, and a process (Step 4) of removing ammonia over the wafer 200 are performed as a cycle, and the cycle is repeated a plurality of times so as to form a silicon-rich silicon nitride (SiN) film. In the process (Step 1) of supplying dichlorosilane to the wafer 200, a silicon film including several or less atomic layers (i.e., 1/n atomic layer to several atomic layers where n is a natural number) is formed. At this time, silicon (Si) is excessively supplied. In the process (Step 3) of supplying ammonia to the wafer 200, the silicon film including several or less atomic layers formed on the wafer 200 is thermally nitrided. At this time, the nitridation of the silicon film is performed under a condition where the nitriding reaction of the silicon film by the ammonia is not saturated. That is, the silicon film is not completely nitrided such that some of the bonding electrons of silicon (Si) are not coupled with the nitrogen (N). In this way, nitridation of silicon (Si) is suppressed and thus a silicon excess state can be obtained. To nitride the silicon film under a condition where the nitriding reaction of the silicon film is not saturated, preferably, at least one of the supply flowrate of ammonia, the supply time of ammonia, and the pressure inside the process chamber 201 may be set to be different from conditions that the nitriding reaction of the silicon film is saturated. That is, the supply flowrate of ammonia, the supply time of ammonia, or the pressure inside the process chamber 201 may be reduced as compared with a condition that the nitriding reaction of the silicon film is saturated. For example, an amount of ammonia less than an amount necessary for forming a silicon nitride ($Si_3N_4$) film having a stoichiometric composition may be supplied. As described above, a silicon-rich silicon nitride (SiN) film having a controlled Si/N ratio can be formed by: controlling the amount of silicon (Si) supplied in a process of forming a silicon film including several or less atomic layers on a wafer 200 by a CVD method; controlling the amount of nitridation of silicon (Si) in a process of thermally nitriding the silicon film by using ammonia; and alternately repeating the processes.

Figure 3:
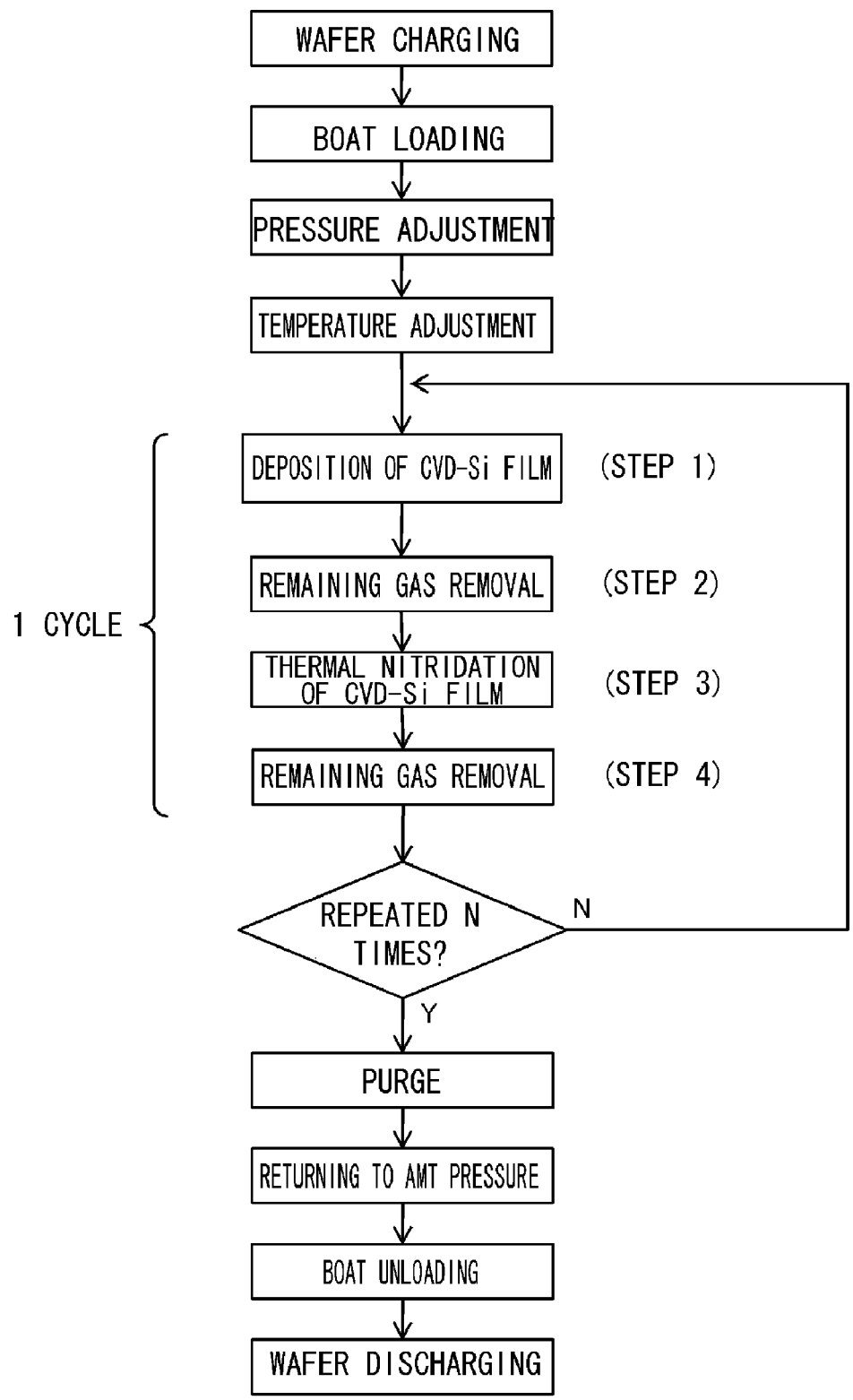
FIG. 3 is a flowchart for explaining a film-forming method according to an embodiment of the present invention.

Hereinafter, the film-forming method of the current embodiment will now be described in detail with reference to FIG. 3.

After a plurality of wafers 200 are charged into the boat 217 (wafer charging), as shown in FIG. 1, the boat 217 in which the plurality of wafers 200 are charged is lifted and loaded into the process chamber 201 by the boat elevator 115 (boat loading). In this state, the bottom side of the manifold 209 is sealed by the seal cap 219 with the O-ring 220b being disposed therebetween.

The inside of the process chamber 201 is evacuated to a desired pressure (vacuum degree) by using the vacuum pump 246. At this time, the pressure inside the process chamber 201 is measured by the pressure sensor 245, and based on the measured pressure, the APC valve 242 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Thereafter, the following four steps are sequentially performed.

(Step 1)

The first valve 243a of the first gas supply pipe 232a, and the third valve 243c of the first inert gas supply pipe 234a are opened so as to allow dichlorosilane to flow through the first gas supply pipe 232a and allow inert gas such as $N_2$ to flow through the first inert gas supply pipe 234a. The flowrate of inert gas flowing through the first inert gas supply pipe 234a is controlled by the third mass flow controller 241c. The flowrate of dichlorosilane flowing through the first gas supply pipe 232a is controlled by the first mass flow controller 241a, and the dichlorosilane is mixed with the flowrate-controlled inert gas. Then, the mixture is supplied to the inside of the process chamber 201 through the first gas supply holes 248a of the first nozzle 233a and is discharged through the gas exhaust pipe 231. At this time, the APC valve 242 is properly controlled to keep the inside of the process chamber 201 at a pressure of 133 Pa to 1333 Pa, for example, 133 Pa. The first mass flow controller 241a is used to adjust the flowrate of dichlorosilane in the range from 0.1 slm to 10 slm, for example, 0.5 slm. The wafers 200 are exposed to dichlorosilane, for example, for 1 second to 180 seconds. At this time, the heater 207 is controlled to allow thermal decomposition of dichlorosilane for inducing CVD reaction. That is, the heater 207 is controlled to heat the wafers 200 to a temperature of 550° C. to 700° C., for example, 630° C. By supplying dichlorosilane to the inside of the process chamber 201 under the above-described conditions, silicon (Si) films each including several or less atomic layers (that is, 1/n atomic layer to several atomic layers) are formed on the wafers (deposition of CVD-Si film). For example, silicon films each including a half atomic layer (half layer) may be formed, and silicon films each including a mono atomic layer (mono-layer) may be formed. In this way, silicon (Si) is excessively supplied.

(Step 2)

After the silicon films each including several or less atomic layers are formed, the first valve 243a of the first gas supply pipe 232a is closed so as to interrupt supply of dichlorosilane. At this time, in a state where the APC valve 242 of the gas exhaust pipe 231 is opened, the inside of the process chamber 201 is exhausted to 10 Pa or less by using the vacuum pump 246, and remaining dichlorosilane is removed from the inside of the process chamber 201. Along with this, if inert gas such as $N_2$ is supplied to the inside of the process chamber 201, the remaining dichlorosilane can be removed more efficiently (remaining gas removal).

(Step 3)

The second valve 243b of the second gas supply pipe 232b, the fourth valve 243d of the second inert gas supply pipe 234b are opened so as to allow ammonia to flow through the second gas supply pipe 232b and allow inert gas such as $N_2$ to flow through the second inert gas supply pipe 234b. The flowrate of inert gas flowing through the second inert gas supply pipe 234b is controlled by the fourth mass flow controller 241d. The flowrate of ammonia flowing through the second gas supply pipe 232b is controlled by the second mass flow controller 241b, and the ammonia is mixed with the flowrate-controlled inert gas. Then, the mixture is supplied to the inside of the process chamber 201 through the second gas supply holes 248b of the second nozzle 233b and is discharged through the gas exhaust pipe 231. As described above, ammonia is supplied to the inside of the process chamber 201 in a state where the ammonia is not activated by plasma.

In Step 3, the inside conditions of the process chamber 201 are adjusted so that the silicon films are nitrided under the condition where the nitriding reaction of the silicon film by the ammonia is not saturated. That is, the amount of ammonia supply is adjusted to be less than an amount necessary for nitriding the silicon films to form silicon nitride ($Si_3N_4$) films each having a stoichiometric composition. In addition, at this time, the APC valve 242 is properly adjusted to keep the inside of the process chamber 201 at a pressure of 133 Pa to 1333 Pa, for example, 865 Pa. The second mass flow controller 241b is controlled to supply ammonia at a flowrate of 0.1 slm to 10 slm, for example, 1 slm. The wafers 200 are exposed to ammonia for 1 second to 180 seconds. At this time, the heater 207 is controlled so as to keep the wafers 200 in the same temperature range of 550° C. to 700° C., for example, 630° C. in which dichlorosilane is supplied in Step 1. In this way, ammonia is supplied to the inside of the process chamber 201 in a non-plasma condition, so as to thermally nitride the silicon films each including several or less atomic layers and formed on the wafers 200 (thermal nitridation of CVD-Si film). At this time, since silicon is excessive due to the restrained nitridation of silicon (Si), silicon-rich silicon nitride films can be formed.

If it is assumed that all dichlorosilane and ammonia supplied to the inside of the process chamber 201 are used to form a silicon nitride film, a silicon nitride ($Si_3N_4$) film having a stoichiometric composition can be formed on a wafer 200 by supplying dichlorosilane being the silicon-containing substance and ammonia being the nitrogen-containing substance to the inside of the process chamber 201 at a ratio of 3:4. In the current embodiment, however, the amount of supplied ammonia is less than an amount necessary for thermally nitriding a silicon film to form a silicon nitride ($Si_3N_4$) film having a stoichiometric composition. That is, the amount of ammonia supply is restricted so as not to saturate nitridation reaction of the silicon film. In this way, the amount of nitrogen is adjusted to be insufficient for forming a silicon nitride ($Si_3N_4$) film having a stoichiometric composition, so that a silicon-rich silicon nitride film can be formed on the wafer 200.

Practically, the composition ratio of silicon/nitrogen of a silicon nitride film is varied not only by the amount of ammonia supply, but also by other conditions in Step 3, such as difference of reactiveness caused by the inside pressure of the process chamber 201, difference of reactiveness caused by the temperature of a wafer 200, the supply flowrate of ammonia, and the supply time of ammonia (that is, reaction time). In addition, the composition ratio of silicon and nitrogen of a silicon nitride film is also varied by conditions in Step 1, such as the pressure inside the process chamber 201, the temperature of a wafer 200, the supply flowrate of dichlorosilane, and the supply time of dichlorosilane. That is, controlling of the balance between the supply of silicon (Si) in Step 1 and the supply of nitrogen (N) in Step 3 is important for controlling the composition ratio of silicon and nitrogen (Si/N ratio) of a silicon nitride film. In the current embodiment, the pressure inside the process chamber 201, the temperature of a wafer 200, the supply flowrate of gas, and the supply time of gas are properly controlled within the above-described mentioned ranges, so as to control the composition ratio of silicon/nitrogen of a silicon nitride film. If the amount of silicon (Si) supplied in Step 1 is concerned as a reference (is fixed to a predetermined value), the silicon (Si)/nitrogen (N) ratio is most dependent on the supply flowrate of ammonia, the supply time of ammonia, and the pressure inside the process chamber 201 among conditions in Step 3. Therefore, in Step 3, it is preferable that at least one of the supply flowrate of ammonia, the supply time of ammonia, and the pressure inside the process chamber 201 be different from conditions where the nitridation reaction of a silicon film is saturated. Specifically, the supply flowrate of ammonia, the supply time of ammonia, or the pressure inside the process chamber 201 may be reduced as compared with a condition where the nitridation reaction of a silicon film is saturated.

(Step 4)

After the silicon films each including several or less atomic layers are thermally nitrided, the second valve 243b of the second gas supply pipe 232b is closed to interrupt supply of ammonia. At this time, in a state where the APC valve 242 of the gas exhaust pipe 231 is opened, the inside of the process chamber 201 is exhausted to a pressure of 10 Pa or less, and remaining ammonia is removed from the inside of the process chamber 201. Along with this, if inert gas such as $N_2$ is supplied to the inside of the process chamber 201, remaining ammonia can be removed more efficiently (remaining gas removal).

By setting above-mentioned Steps 1 to 4 to one cycle, and repeating this cycle a plurality of times, silicon-rich silicon nitride films can be formed on the wafers 200 to a predetermined thickness.

After silicon-rich silicon nitride films are formed to a predetermined thickness, the inside of the process chamber 201 is purged by supplying inert gas such as $N_2$ to the inside of the process chamber 201 and exhausting the inert gas from the inside of the process chamber 201 (purge). By this, the inside atmosphere of the process chamber 201 is replaced with inert gas, and the inside pressure of the process chamber 201 is returned to atmospheric pressure (returning to atmospheric pressure).

Thereafter, the seal cap 219 is moved downward by the boat elevator 115 so as to open the bottom side of the manifold 209 and unload the processed wafers 200 from the inside of the process tube 203 through the bottom side of the manifold 209 in a state where the processed wafers 200 are held in the boat 217 (boat unloading). Then, the processed wafers 200 are discharged from the boat 217 (wafer discharging).

(3) Effects of Current Embodiment

According to the current embodiment, the following one or more effects can be obtained.

According to the current embodiment, in the process (Step 1) of supplying dichlorosilane to wafers 200, a processing condition is set to a condition where a CVD reaction is caused. That is, the wafers 200 is heated to a temperature of 550° C. to 700° C., for example, 630° C. Owing to this, dichlorosilane is not only adsorbed on the wafers 200 but also is thermally decomposed on the wafers 200 to cause CVD reaction, so that 1/n atomic layer to several atomic layers of silicon can be deposited on the wafers 200. In this way, it becomes possible to make the amount of silicon deposited on the wafers 200 excessive.

According to the current embodiment, in the process (Step 1) of supplying dichlorosilane to wafers 200, a CVD reaction is caused by thermally decompose dichlorosilane on the wafers 200. Owing to this, the film-forming rate can be increased, and thus the productivity of a substrate processing process can be increased. In addition to the increased film-forming rate, film-forming is possible at a relatively low temperature, so that the wafers 200 can be processed with smaller thermal budget.

Furthermore, according to the current embodiment, in the process (Step 3) of supplying ammonia to wafers 200, the condition of the inside of the process chamber 201 is controlled such that the nitridation reaction of silicon films formed on the wafers 200 by ammonia is not saturated. For example, an amount of ammonia less than an amount necessary for forming a stoichiometric silicon nitride ($Si_3N_4$) film is supplied. Therefore, since nitrogen is insufficient for forming a stoichiometric silicon nitride ($Si_3N_4$), silicon-rich silicon nitride (SiN) films can be formed on the wafers 200.

Furthermore, according to the current embodiment, the pressure inside the process chamber 201, the temperature of wafers 200, the supply flowrate of ammonia, and the supply time of ammonia are controlled within the above-described mentioned ranges, so that the composition ratio of silicon and nitrogen of a silicon nitride film can be adjusted to a predetermined value. For example, in Step 3 after Step 1, the inside of the process chamber 201 can be kept at the same temperature as in Step 1 but at a higher pressure as compared with Step 1, so as to adjust the composition ratio of silicon and nitrogen (silicon/nitrogen) to a predetermined value in the range from 1.0 to 0.75 when nitriding a silicon film including 1/n atomic layer to several atomic layers and deposited in Step 1. In addition, for example, in Step 3 after Step 1, the silicon (Si)/nitrogen (N) ratio of a silicon nitride film can be adjusted by controlling the flowrate of ammonia or the supply time of ammonia in a state where the inside of the process chamber 201 is kept at the same temperature as in Step 1. In addition, for example, in Step 3 after Step 1, the silicon (Si)/nitrogen (N) ratio of a silicon nitride film can be adjusted by controlling the inside temperature of the process chamber 201. That is, in Step 3, by controlling at least one of the inside temperature of the process chamber 201, the inside pressure of the process chamber 201, the supply flowrate of ammonia, and the supply time of ammonia, an amount of nitridation of silicon (Si) deposited in Step 1 can be controlled to adjust the silicon (Si)/nitrogen (N) ratio of a silicon nitride film. In addition, the silicon (Si)/nitrogen (N) ratio may be adjusted by forming a silicon film including several atomic layers in Step 1 and nitriding only (the uppermost) one of the atomic layers of the silicon film in Step 3, or the silicon (Si)/nitrogen (N) ratio may be adjusted by forming a silicon film including two atomic layers in Step 1 and nitriding only (the upper) one of the atomic layers of the silicon film in Step 3.

In addition, according to the current embodiment, by adjusting at least one of supply conditions of dichlorosilane in Step 1 and supply conditions of ammonia in Step 3 and controlling the balance between the amount of silicon (Si) supply and the amount of nitridation of silicon (Si) (the amount of nitrogen (N) supply), the composition ratio of silicon (Si) and nitrogen (N) of a silicon nitride film can be arbitrarily controlled. Furthermore, by controlling the composition ratio of silicon (Si) and nitrogen (N) of a silicon nitride film, qualities (properties) of the silicon nitride film such as charge trapping ability, etching rate, electric permittivity, and film stress can be controlled.

In addition, according to the current embodiment, a film-forming process is performed by a method similar to an ALD method but somewhat different from the ALD method. That is, a process (Step 1) of supplying dichlorosilane to a wafer 200 for depositing a CVD-Si film on the wafer 200; a process (Step 2) of removing dichlorosilane over the wafer 200; a process (Step 3) of supplying ammonia to the wafer 200 for thermally nitriding the CVD-Si film formed on the wafer 200;

and a process (Step 4) of removing ammonia over the wafer 200 are performed as a cycle, and the cycle is repeated a plurality of times. By alternately supplying dichlorosilane and ammonia to the wafer 200, the rate of film-forming reaction on the wafer 200 can be controlled, and the step coverage of a silicon nitride (SiN) film can be improved. Furthermore, the thickness uniformity in the surface of the wafer 200 can be improved.

EXAMPLES

Hereinafter, Examples and Comparative Examples will be described with reference to FIG. 4A and FIG. 4B according to the present invention.

Example 1

In Example 1, it was attempted to control the composition ratio of silicon and nitrogen of a silicon nitride film by adjusting various conditions of Step 1. As a result of the attempt, a silicon (Si) film including 1/n atomic layer to several atomic layers was formed on a wafer 200 in Step 1 by adjusting the inside pressure of the process chamber 201 to 6.5 Torr, the temperature of the wafer 200 to 600° C., the supply flowrate of dichlorosilane to 0.5 slm, and the supply time of dichlorosilane to 60 seconds. In Step 3, the inside pressure of the process chamber 201 was adjusted to 6.5 Torr, the temperature of the wafer 200 was adjusted to 600° C., the supply flowrate of ammonia was adjusted to 5 slm, and the supply time of ammonia was adjusted to 30 seconds. As a result, a film-forming rate equal to or greater than 1.0 Å was obtained. In addition, the composition ratio of silicon and nitrogen (Si/N ratio) of a silicon nitride film was 1.0. That is, a silicon-rich silicon nitride film could be obtained (Refer to No. 1 in FIG. 4A).

Example 2

In Example 2, it was attempted to control the composition ratio of silicon and nitrogen of a silicon nitride film by adjusting various conditions of Step 1. As a result of the attempt, a silicon (Si) film including 1/n atomic layer to several atomic layers was formed on a wafer 200 in Step 1 by adjusting the inside pressure of the process chamber 201 to 6.5 Torr, the temperature of the wafer 200 to 630° C., the supply flowrate of dichlorosilane to 0.5 slm, and the supply time of dichlorosilane to 10 seconds. In Step 3, the inside pressure of the process chamber 201 was adjusted to 6.5 Torr, the temperature of the wafer 200 was adjusted to 630° C., the supply flowrate of ammonia was adjusted to 5 slm, and the supply time of ammonia was adjusted to 30 seconds. As a result, a film-forming rate equal to or greater than 1.0 Å was obtained. In addition, the composition ratio of silicon and nitrogen (Si/N ratio) of a silicon nitride film was 1.0. That is, a silicon-rich silicon nitride film could be obtained (Refer to No. 2 in FIG. 4A).

Example 3

In Example 3, it was attempted to control the composition ratio of silicon and nitrogen of a silicon nitride film by adjusting various conditions of Step 1. As a result of the attempt, a silicon (Si) film including 1/n atomic layer to several atomic layers was formed on a wafer 200 in Step 1 by adjusting the inside pressure of the process chamber 201 to 1 Torr, the temperature of the wafer 200 to 630° C., the supply flowrate of dichlorosilane to 10 slm, and the supply time of dichlorosilane to 10 seconds. In Step 3, the inside pressure of the process chamber 201 was adjusted to 6.5 Torr, the temperature of the wafer 200 was adjusted to 630° C., the supply flowrate of ammonia was adjusted to 5 slm, and the supply time of ammonia was adjusted to 30 seconds. As a result, a film-forming rate equal to or greater than 1.0 Å was obtained. In addition, the composition ratio of silicon and nitrogen (Si/N ratio) of a silicon nitride film was 1.0. That is, a silicon-rich silicon nitride film could be obtained (Refer to No. 3 in FIG. 4A).

Example 4

In Example 4, it was attempted to control the composition ratio of silicon and nitrogen of a silicon nitride film by adjusting various conditions of Step 1. As a result of the attempt, a silicon (Si) film including 1/n atomic layer to several atomic layers was formed on a wafer 200 in Step 1 by adjusting the inside pressure of the process chamber 201 to 1 Torr, the temperature of the wafer 200 to 630° C., the supply flowrate of dichlorosilane to 0.5 slm, and the supply time of dichlorosilane to 30 seconds. In Step 3, the inside pressure of the process chamber 201 was adjusted to 6.5 Torr, the temperature of the wafer 200 was adjusted to 630° C., the supply flowrate of ammonia was adjusted to 5 slm, and the supply time of ammonia was adjusted to 30 seconds. As a result, a film-forming rate equal to or greater than 1.0 Å was obtained. In addition, the composition ratio of silicon and nitrogen (Si/N ratio) of a silicon nitride film was 1.0. That is, a silicon-rich silicon nitride film could be obtained (Refer to No. 4 in FIG. 4A).

Example 5

In Example 5, it was attempted to control the composition ratio of silicon and nitrogen of a silicon nitride film by adjusting various conditions of Step 3. As a result of the attempt, in Step 1, the inside pressure of the process chamber 201 was adjusted to 1 Torr, the temperature of the wafer 200 was adjusted to 630° C., the supply flowrate of dichlorosilane was adjusted to 0.5 slm, and the supply time of dichlorosilane was adjusted to 15 seconds; and in Step 3, the inside pressure of the process chamber 201 was adjusted to 6.5 Torr, the temperature of the wafer 200 was adjusted to 630° C., the supply flowrate of ammonia was adjusted to 1 slm, and the supply time of ammonia was adjusted to 6 seconds (i.e., the time during which the wafer 200 was exposed to ammonia was adjusted to 6 seconds). As a result, the composition ratio of silicon and nitrogen (Si/N ratio) of a silicon nitride film was 1.0. That is, a silicon-rich silicon nitride film could be obtained (Refer to No. 5 in FIG. 4A).

Example 6

In Example 6, it was attempted to control the composition ratio of silicon and nitrogen of a silicon nitride film by adjusting various conditions of Step 3. As a result of the attempt, in Step 1, the inside pressure of the process chamber 201 was adjusted to 1 Torr, the temperature of the wafer 200 was adjusted to 630° C., the supply flowrate of dichlorosilane was adjusted to 0.5 slm, and the supply time of dichlorosilane was adjusted to 15 seconds; and in Step 3, the inside pressure of the process chamber 201 was adjusted to 6.5 Torr, the temperature of the wafer 200 was adjusted to 630° C., the supply flowrate of ammonia was adjusted to 10 slm, and the supply time of ammonia was adjusted to 6 seconds (i.e., the time during which the wafer 200 was exposed to ammonia was adjusted to 6 seconds). As a result, the composition ratio of silicon and nitrogen (Si/N ratio) of a silicon nitride film was 0.9. That is, a silicon-rich silicon nitride film could be obtained (Refer to No. 6 in FIG. 4A).

Comparative Example 1

In Step 1, the inside pressure of the process chamber 201 was adjusted to 1 Torr, the temperature of the wafer 200 was adjusted to 630° C., the supply flowrate of dichlorosilane was adjusted to 0.5 slm, and the supply time of dichlorosilane was adjusted to 15 seconds; and in Step 3, the inside pressure of the process chamber 201 was adjusted to 6.5 Torr, the temperature of the wafer 200 was adjusted to 630° C., the supply flowrate of ammonia was adjusted to 1 slm, and the supply time of ammonia was adjusted to 24 seconds (i.e., the time during which the wafer 200 was exposed to ammonia was adjusted to 24 seconds). As a result, nitridation reaction of a silicon film was saturated, and thus the composition ratio of silicon and nitrogen (Si/N ratio) of a silicon nitride film was 0.75. That is, a silicon nitride film having a stoichiometric composition was formed, and a silicon-rich silicon nitride film could not be obtained (Refer to No. 1 in FIG. 4B). In Comparative Example 1, other conditions than the supply time of ammonia were equal to those of Example 5.

Comparative Example 2

In Step 1, the inside pressure of the process chamber 201 was adjusted to 1 Torr, the temperature of the wafer 200 was adjusted to 630° C., the supply flowrate of dichlorosilane was adjusted to 0.5 slm, and the supply time of dichlorosilane was adjusted to 15 seconds; and in Step 3, the inside pressure of the process chamber 201 was adjusted to 20 Torr, the temperature of the wafer 200 was adjusted to 630° C., the supply flowrate of ammonia was adjusted to 1 slm, and the supply time of ammonia was adjusted to 6 seconds (i.e., the time during which the wafer 200 was exposed to ammonia was adjusted to 6 seconds). As a result, nitridation reaction of a silicon film was saturated, and thus the composition ratio of silicon and nitrogen (Si/N ratio) of a silicon nitride film was 0.75. That is, a silicon nitride film having a stoichiometric composition was formed, and a silicon-rich silicon nitride film could not be obtained (Refer to No. 2 in FIG. 4B). In Comparative Example 2, other conditions than the inside pressure of the process chamber 201 in Step 3 were equal to those of Example 5.

Comparative Example 3

In Step 1, the inside pressure of the process chamber 201 was adjusted to 1 Torr, the temperature of the wafer 200 was adjusted to 630° C., the supply flowrate of dichlorosilane was adjusted to 0.5 slm, and the supply time of dichlorosilane was adjusted to 30 seconds, so as to deposit a thin silicon film including 1/n atomic layer to several atomic layers on the wafer 200. Thereafter, in Step 3, the inside pressure of the process chamber 201 was adjusted to 5 Torr, the temperature of the wafer 200 was adjusted to 630° C., the supply flowrate of ammonia was adjusted to 5 slm, and the supply time of ammonia was adjusted to 30 seconds; and then ammonia activated by plasma was supplied to the inside of the process chamber 201. As a result, nitridation reaction of the silicon film was saturated, and thus all the silicon film was nitrided. Therefore, the composition ratio of silicon and nitrogen (Si/N ratio) of the silicon nitride film was 0.75. That is, a silicon-rich silicon nitride film could not be obtained. In the case where ammonia activated by plasma was supplied to the inside of the process chamber 201, it was difficult to obtain a silicon-rich silicon nitride film (Refer to No 3 in FIG. 4B).

Comparative Example 4

In Step 1, the inside pressure of the process chamber 201 was adjusted to 0.5 Torr, the temperature of the wafer 200 was adjusted to 600° C., the supply flowrate of dichlorosilane was adjusted to 0.5 slm, and the supply time of dichlorosilane was adjusted to 10 seconds. However, a silicon film was not deposited on the wafer 200. That is, in Step 1, although the temperature of the wafer 200 was adjusted to 600° C., it was difficult to deposit a silicon film on the wafer 200 because the inside pressure of the process chamber 201 was adjusted to 0.5 Torr or lower (Refer to No 4 in FIG. 4B).

According to the method of manufacturing a semiconductor device and the substrate processing apparatus of the present invention, a silicon nitride film can be formed on a substrate while controlling the silicon (Si)/nitrogen (N) ratio of the silicon nitride film. That is, a silicon nitride film including stoichiometrically excessive silicon with respect to nitrogen can be formed.

(Supplementary Note)

The present invention also includes the following preferred embodiments.

(Supplementary Note 1)

According to an embodiment of the present invention, there is provided a method of manufacturing a semiconductor device, the method including forming a silicon nitride film on a substrate in a process chamber using a dichlorosilane and an ammonia, wherein the forming the silicon nitride film includes repeating a cycle to form a silicon nitride film including stoichiometrically excessive silicon with respect to nitrogen, the cycle including: (a) forming a silicon film including several or less atomic layers on the substrate in the process chamber by supplying the dichlorosilane to the substrate under a condition where a CVD reaction is caused; (b) removing the dichlorosilane remaining in the process chamber; (c) thermally nitriding the silicon film by supplying the ammonia to the substrate in the process chamber and causing a nitriding reaction of the silicon film in a non-plasma atmosphere under a condition where the nitriding reaction of the silicon film by the ammonia is not saturated; and (d) removing the ammonia remaining in the process chamber.

(Supplementary Note 2)

In the method of Supplementary Note 1, it is preferable that in the step (c), a condition inside the process chamber is set such that the nitriding reaction of the silicon film is not saturated by differentiating at least one of a supply flowrate of the ammonia, a supply time of the ammonia, and a pressure inside the process chamber from those of a condition where the nitriding reaction of the silicon film is saturated.

(Supplementary Note 3)

In the method of Supplementary Note 1, it is preferable that in the step (c), a condition inside the process chamber is set such that the nitriding reaction of the silicon film is not saturated by reducing at least one of a supply flowrate of the ammonia, a supply time of the ammonia, and a pressure inside the process chamber to be respectively less, shorter and lower than those of a condition where the nitriding reaction of the silicon film is saturated.

(Supplementary Note 4)

In the method of Supplementary Note 1, it is preferable that in the step (c), at least one of a supply flowrate of the ammonia, a supply time of the ammonia, and a pressure inside the process chamber is adjusted so as to control a composition ratio of the silicon nitride film.

(Supplementary Note 5)

According to another embodiment of the present invention, there is provided a substrate processing apparatus including: a process chamber configured to process a substrate; a first gas supply system configured to supply dichlorosilane to an inside of the process chamber; a second gas supply system configured to supply ammonia to the inside of the process chamber; a heater configured to heat the substrate disposed in the process chamber; and a controller configured to control the first gas supply system, the second gas supply system, and the heater, so as to form a silicon nitride film comprising stoichiometrically excessive silicon with respect to nitrogen on the substrate, by supplying dichlorosilane to the substrate under a condition where CVD reaction is caused to form a silicon film comprising several or less atomic layers on the substrate, supplying ammonia to the substrate in a non-plasma atmosphere to thermally nitride the silicon film under a condition where the nitriding reaction of the silicon film by the ammonia is not saturated, and alternately repeating the supplying of dichlorosilane and the supplying of ammonia.

What is claimed is:

1. A method of manufacturing a semiconductor device, the method comprising forming a silicon nitride film on a substrate in a process chamber using a dichlorosilane and an ammonia, wherein forming the silicon nitride film comprises repeating a cycle to form a silicon nitride film comprising stoichiometrically excessive silicon with respect to nitrogen, the cycle comprising:
(a) forming a silicon film comprising several or less atomic layers on the substrate in the process chamber by supplying the dichlorosilane to the substrate under a condition where a CVD reaction is caused;
(b) removing the dichlorosilane remaining in the process chamber;
(c) thermally nitriding the silicon film by supplying the ammonia to the substrate in the process chamber and causing a nitriding reaction of the silicon film in a non-plasma atmosphere under a condition where the nitriding reaction of the silicon film by the ammonia is not saturated; and
(d) removing the ammonia remaining in the process chamber.

2. The method of claim 1, wherein, in the step (c), a condition inside the process chamber is set such that nitriding reaction of the silicon film is not saturated by differentiating at least one of a supply flowrate of the ammonia, a supply time of the ammonia, and a pressure inside the process chamber from those of a condition where the nitriding reaction of the silicon film is saturated.

3. The method of claim 1, wherein, in the step (c), a condition inside the process chamber is set such that the nitriding reaction of the silicon film is not saturated by reducing at least one of a supply flowrate of the ammonia, a supply time of the ammonia, and a pressure inside the process chamber to be respectively less, shorter and lower than those of a condition where the nitriding reaction of the silicon film is saturated.

4. The method of claim 1, wherein, in the step (c), at least one of a supply flowrate of the ammonia, a supply time of the ammonia, and a pressure inside the process chamber is adjusted so as to control a composition ratio of the silicon nitride film.

5. The method of claim 1, wherein the step (a) comprises forming the silicon film comprising the several atomic layers, and the step (c) comprises thermally nitriding one of the several atomic layers of the silicon film.

6. The method of claim 1, wherein the step (a) comprises forming the silicon film comprising two atomic layers, and the step (c) comprises thermally nitriding one of the two atomic layers of the silicon film.

7. The method of claim 1, wherein the step (c) comprises thermally nitriding the silicon film in a manner that a portion of bonding electrons of a silicon atom constituting the silicon film is not coupled with a nitrogen atom constituting the ammonia.

8. A method of processing a substrate, the method comprising forming a silicon nitride film on the substrate in a process chamber using a dichlorosilane and an ammonia, wherein the forming the silicon nitride film comprises repeating a cycle to form a silicon nitride film comprising stoichiometrically excessive silicon with respect to nitrogen, the cycle comprising:
(a) forming a silicon film comprising several or less atomic layers on the substrate in the process chamber by supplying the dichlorosilane to the substrate under a condition where a CVD reaction is caused;
(b) removing the dichlorosilane remaining in the process chamber;
(c) thermally nitriding the silicon film by supplying the ammonia to the substrate in the process chamber and causing a nitriding reaction of the silicon film in a non-plasma atmosphere under a condition where the nitriding reaction of the silicon film by the ammonia is not saturated; and
(d) removing the ammonia remaining in the process chamber.

9. The method of claim 8, wherein, in the step (c), a condition inside the process chamber is set such that the nitriding reaction of the silicon film is not saturated by differentiating at least one of a supply flowrate of the ammonia, a supply time of the ammonia, and a pressure inside the process chamber from those of a condition where the nitriding reaction of the silicon film is saturated.

10. The method of claim 8, wherein, in the step (c), a condition inside the process chamber is set such that the nitriding reaction of the silicon film is not saturated by reducing at least one of a supply flowrate of the ammonia, a supply time of the ammonia, and a pressure inside the process chamber to be respectively less, shorter and lower than those of a condition where the nitriding reaction of the silicon film is saturated.

11. The method of claim 8, wherein, in the step (c), at least one of a supply flowrate of the ammonia, a supply time of the ammonia, and a pressure inside the process chamber is adjusted so as to control a composition ratio of the silicon nitride film.

12. The method of claim 8, wherein the step (a) comprises forming the silicon film comprising the several atomic layers, and the step (c) comprises thermally nitriding one of the several atomic layers of the silicon film.

13. The method of claim 8, wherein the step (a) comprises forming the silicon film comprising two atomic layers, and the step (c) comprises thermally nitriding one of the two atomic layers of the silicon film.

14. The method of claim 8, wherein the step (c) comprises thermally nitriding the silicon film in a manner that a portion of bonding electrons of a silicon atom constituting the silicon film is not coupled with a nitrogen atom constituting the ammonia.

* * * * *